United States Patent
Lai

(10) Patent No.: US 7,158,404 B2
(45) Date of Patent: Jan. 2, 2007

(54) POWER MANAGEMENT CIRCUIT AND MEMORY CELL

(75) Inventor: Fang-Shi Lai, Chia Yi (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 79 days.

(21) Appl. No.: 10/899,320

(22) Filed: Jul. 26, 2004

(65) Prior Publication Data

US 2006/0018146 A1    Jan. 26, 2006

(51) Int. Cl.
*G11C 11/00* (2006.01)

(52) U.S. Cl. .................. 365/154; 365/156; 365/229

(58) Field of Classification Search ............... 365/154, 365/156, 229
See application file for complete search history.

(56) References Cited

U.S. PATENT DOCUMENTS

| | | | | |
|---|---|---|---|---|
| 5,615,162 | A * | 3/1997 | Houston | 365/226 |
| 6,208,170 | B1 | 3/2001 | Iwaki et al. | 326/121 |
| 6,287,902 | B1 | 9/2001 | Kiro | 438/183 |
| 6,500,715 | B1 | 12/2002 | Matsuzaki et al. | 438/275 |
| 6,657,887 | B1 * | 12/2003 | Higeta et al. | 365/156 |
| 6,664,608 | B1 | 12/2003 | Burr | 257/549 |
| 6,667,648 | B1 | 12/2003 | Stout et al. | 327/333 |
| 6,707,702 | B1 * | 3/2004 | Komatsuzaki | 365/145 |
| 6,724,648 | B1 * | 4/2004 | Khellah et al. | 365/154 |
| 7,020,041 | B1 * | 3/2006 | Somasekhar et al. | 365/229 |
| 2002/0008545 | A1 | 1/2002 | Zama et al. | 326/93 |
| 2004/0196082 | A1 | 10/2004 | Pacha et al. | 327/215 |
| 2006/0017469 | A1 * | 1/2006 | Lai | 326/121 |

OTHER PUBLICATIONS

Office Action mailed Nov. 14, 2005 for U.S. Appl. No. 10/898,750, filed Jul. 26, 2004.
Office Action mailed Nov. 14, 2005 for U.S. Appl. No. 10/898,786, filed Jul. 26, 2004.
"Design and Implementation of Differential Cascode Voltage Switch with Pass-Gate (DCVSPG) Logic for High-Performance Digital Systems", Lai et al., 1997; pp. 563-573.

* cited by examiner

*Primary Examiner*—David Lam
(74) *Attorney, Agent, or Firm*—Thomas, Kayden, Horstemeyer & Risley

(57) ABSTRACT

A circuit for power management of a memory cell. A first power switch is coupled between a power voltage, the power control signal and the memory cell. The first power switch is turned off to disconnect the power voltage and the memory cell when the power control signal is at a predetermined level, such that the memory cell operates in standby mode. A latch circuit is coupled between the power voltage, the first terminal and the second terminal to preserve the voltage levels respectively of the first terminal and the second terminal when the memory cell operates in the standby mode.

29 Claims, 5 Drawing Sheets

POWER MANAGEMENT CIRCUIT AND MEMORY CELL

BACKGROUND OF THE INVENTION

1. Technical Field

The present disclosure relates in general to a circuit for power management of a standard cell application. In particular, the present disclosure relates to a circuit for power management of a static random access memory (SRAM).

2. Description of the Related Art

Many integrated circuit devices, such as microprocessors, include on-board memory devices, such as SRAM devices. For example, SRAM devices are commonly used as cache memory because of their relatively fast speed. SRAM devices are also sold as stand-alone integrated circuits for use as cache memory and for other uses. SRAM devices are also more suitable for use as cache memory than dynamic random access memory ("DRAM") devices because they need not be refreshed, thus making all SRAM memory cells continuously available for a memory access.

FIG. 1 is a block diagram of a portion of a typical array 10 of SRAM cells 12 arranged in rows and columns. A plurality of complementary digit line pairs D, $\overline{D}$ are used to couple complementary data to and from the memory cells 12 in a respective column. Several digit line pairs, typically 16 or 32 digit line pairs, are coupled to respective inputs of a column multiplexer 13. The column multiplexer 13 couples one pair of digit lines corresponding to a column address to a sense amplifier 14 and a write driver 16. The sense amplifier 14 provides a data output (not shown) indicative of the polarity of one digit line D relative to the other $\overline{D}$ responsive to data being read from a memory cell 12 coupled to the selected digit line pair D, $\overline{D}$. The write driver 16 drives a differential voltage onto the digit lines D, $\overline{D}$ to which the write driver 16 is coupled by the column multiplexer 13. The differential voltage applied between the digit lines is indicative of data that is to be written to a memory cell 12 coupled to the digit lines D, $\overline{D}$. An equilibration PMOS transistor 18 is also coupled between each pair of complementary digit lines D, $\overline{D}$ to equalize the voltage between the digit lines D, $\overline{D}$ prior to a memory read operation. Finally, a complementary PMOS bias transistor 20 is coupled to each digit line D, $\overline{D}$ to lightly bias the digit lines D, $\overline{D}$ to $V_{CC}$. The current provided by each pair of bias transistors is controlled by a respective digit line load signal $DLL_N$.

A plurality of word lines WLI–WL4 activates the memory cells 12 in the respective row of memory cells. The word lines WL1–WL4 are coupled to a respective inverter 22 each formed by a PMOS transistor 24 and an NMOS transistor 26 coupled in series between $V_{CC}$ and ground. The gates of the transistors 24, 26 are coupled to each other and to a respective select line SEL WL1–SEL WL4.

FIG. 2 shows a conventional 6-transistor (6-T) SRAM cell. The SRAM cell 12 includes a pair of NMOS access transistors 122 and 124 that allow a differential voltage on the digit lines D, $\overline{D}$, to be read from and written to a storage circuit 30 of the SRAM cell 12. The storage circuit 30 includes NMOS pull-down transistors 32 and 36 that are coupled in a positive-feedback configuration with PMOS pull-up transistors 34 and 38, respectively. Nodes A and B are complementary input/output nodes of the storage circuit 30, and the respective complementary logic values at these nodes represent the state of the SRAM cell 12. For example, when the node A is at logic "1" and the node B is at logic "0", the SRAM cell 40 is storing a logic "1". Conversely, when the node A is at logic "0" and the node B is at logic "1", the SRAM cell 12 is storing a logic "0". Thus, the SRAM cell 12 is bitable, i.e., the SRAM cell 12 can have one of two stable states, logic "1" or logic "0".

However, the conventional circuits described suffer standby leakage problems when the circuits are in standby mode. Standby leakage problems are serious concerns in very deep submicron technology with device size reductions, causing output state of memory cells changed. FIG. 3 shows current leakage sources in a transistor 40. The transistor 40 comprises a gate 42, a source 44, a drain 46 and a well 48. Current leakage is caused by junction leakage $I_1$, weak inversion $I_2$, drain induced barrier lowering $I_3$, gate induced drain leakage $I_4$, punchthrough $I_5$, narrow width effect $I_6$, gate oxide tunneling $I_7$ and hot carrier injection $I_8$.

The increased subthreshold leakage and gate leakage current not only increase the IC reliability issues, but also increase the package cost in order to handle the excess power dissipation. The rapidly increased leakage current leads the huge power consumption when the IC chip is getting larger, faster and denser. Thus, power management techniques become a required design issue. Recently, a patent disclosed a method of handling excessive power consumption problems. Some design issues and limitations, however, were not addressed by the patent.

U.S. Pat. No. 6,664,608 to Burr, et al. discloses a back-biased MOS device. Both p-wells and n-wells are formed on a front side of a bulk material. The N devices and P devices are formed respectively within the P-wells or N-wells. The P-wells or N-wells are electrically isolated from one another and are routed to different potentials to vary their threshold voltages. The changed threshold voltages are than used to reduce subthreshold leakage current thereof.

The leakage of the PMOS transistor is reduced by the back-biased MOS method. The NMOS transistor leakage issue, however, still exist. In addition, the back-biased MOS method presents junction breakdown and gate oxide breakdown concerns and offers limited power savings in very deep submicron technology. Very deep submicron technology has less efficient threshold voltage variation due to use of the backed-gate bias, thus it cannot solve the gate leakage problem for 90 nm technology and beyond.

Leakage of a memory cell is reduced by powering down all the memory cells or reducing the power supply voltage. However, powering down all the memory cells results in the loses of the data stored therein, and a power regular is required to reduce the power supply voltage, thus increasing the design difficulty.

SUMMARY

One object, among others, of the present invention is thus to provide a circuit for power management of memory cells using switches to disconnect the logic cells from supplied voltage, and latches to preserve the output state of the memory cells.

To achieve the above-mentioned object, an embodiment of the present invention provides a memory cell. A first PMOS transistor comprises a first gate, a first drain, and a first source coupled to the power voltage. A first NMOS transistor comprises a second gate coupled to the first gate, a second drain coupled to the first drain, and a second source coupled to a ground voltage. The connection point of the first drain and the second drain is a first terminal. A second PMOS transistor comprises a third gate coupled to the first terminal, a third drain coupled to the first gate, and a third source coupled to the power voltage. A second NMOS transistor comprises a fourth gate coupled to the first terminal, a fourth drain coupled to the third drain, and a fourth source coupled to the ground voltage. The connection point of the third drain and the fourth drain is a second terminal. A first switch is coupled between the first bit line and the first terminal, and is switched according to a voltage level of the word line. A second switch is coupled between the second bit line and the second terminal, and is switched according to a voltage level of the word line. A latch circuit is coupled between the power voltage, the first terminal and the second terminal to preserve the voltage levels respectively of the first terminal and the second terminal.

In addition, an embodiment of the present invention provides a circuit for power management of a memory cell. A first power switch is coupled between a power voltage, the power control signal and the memory cell. The first power switch is turned off to disconnect the power voltage and the memory cell when the power control signal is at a predetermined level, such that the memory cell operates in standby mode. A latch circuit is coupled between the power voltage, the first terminal and the second terminal to preserve the voltage levels respectively of the first terminal and the second terminal when the memory cell operates in standby mode.

BRIEF DESCRIPTION OF THE DRAWINGS

Various aspects of an embodiment of the present invention will become more fully understood from the detailed description, given hereinbelow, and the accompanying drawings. The drawings and description are provided for purposes of illustration only and, thus, are not intended to be limiting of the present invention.

DETAILED DESCRIPTION OF THE INVENTION

Figure 1:
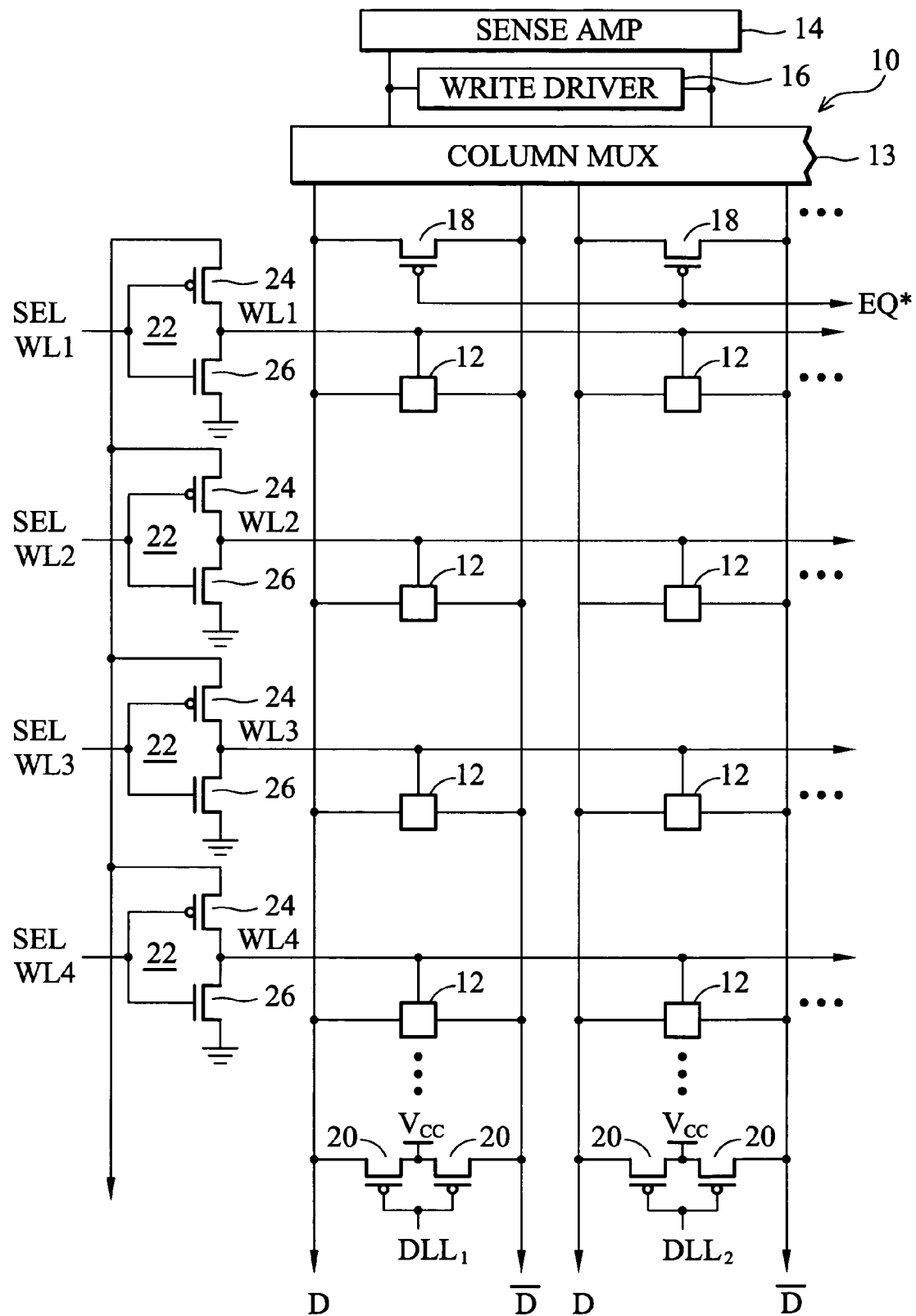
FIG. 1 is a block diagram of a portion of a typical array 10 of SRAM cells 12 arranged in rows and columns.
Figure 2:
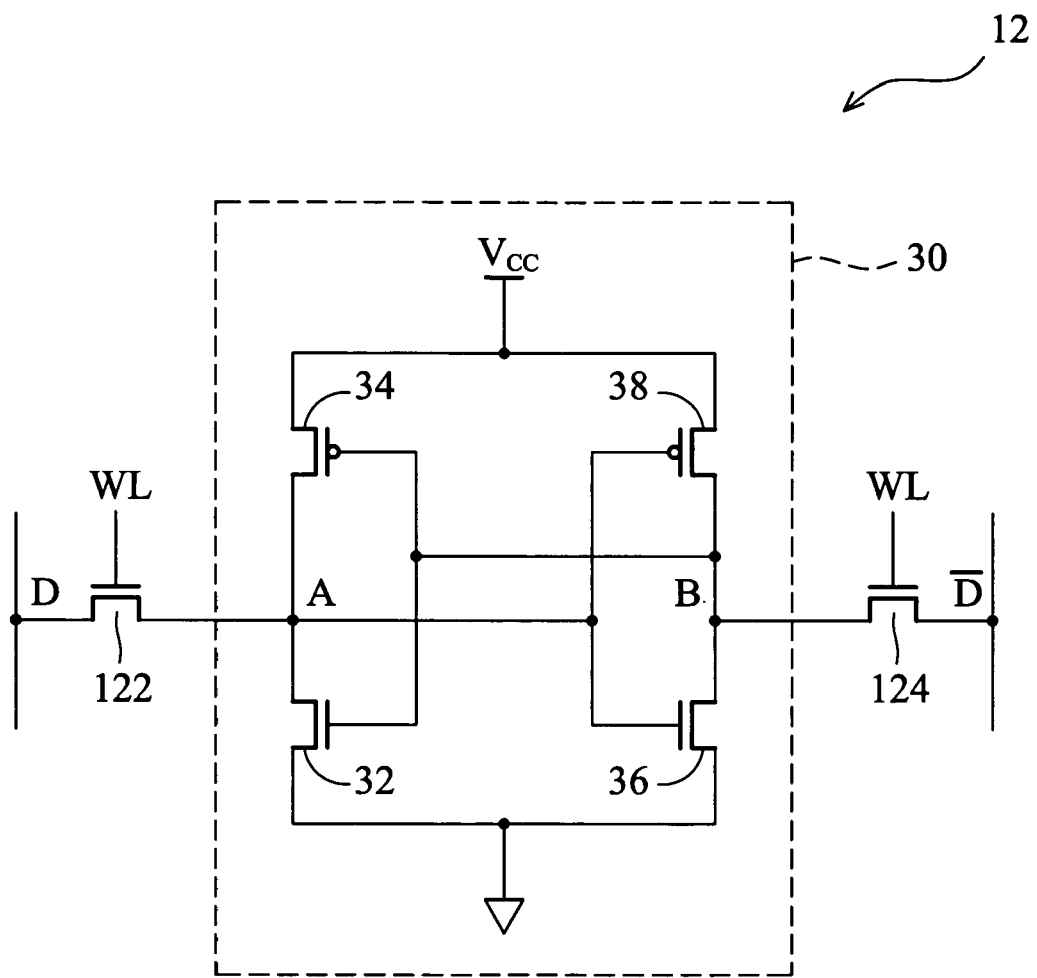
FIG. 2 shows a conventional 6-transistor (6-T) SRAM cell.
Figure 3:
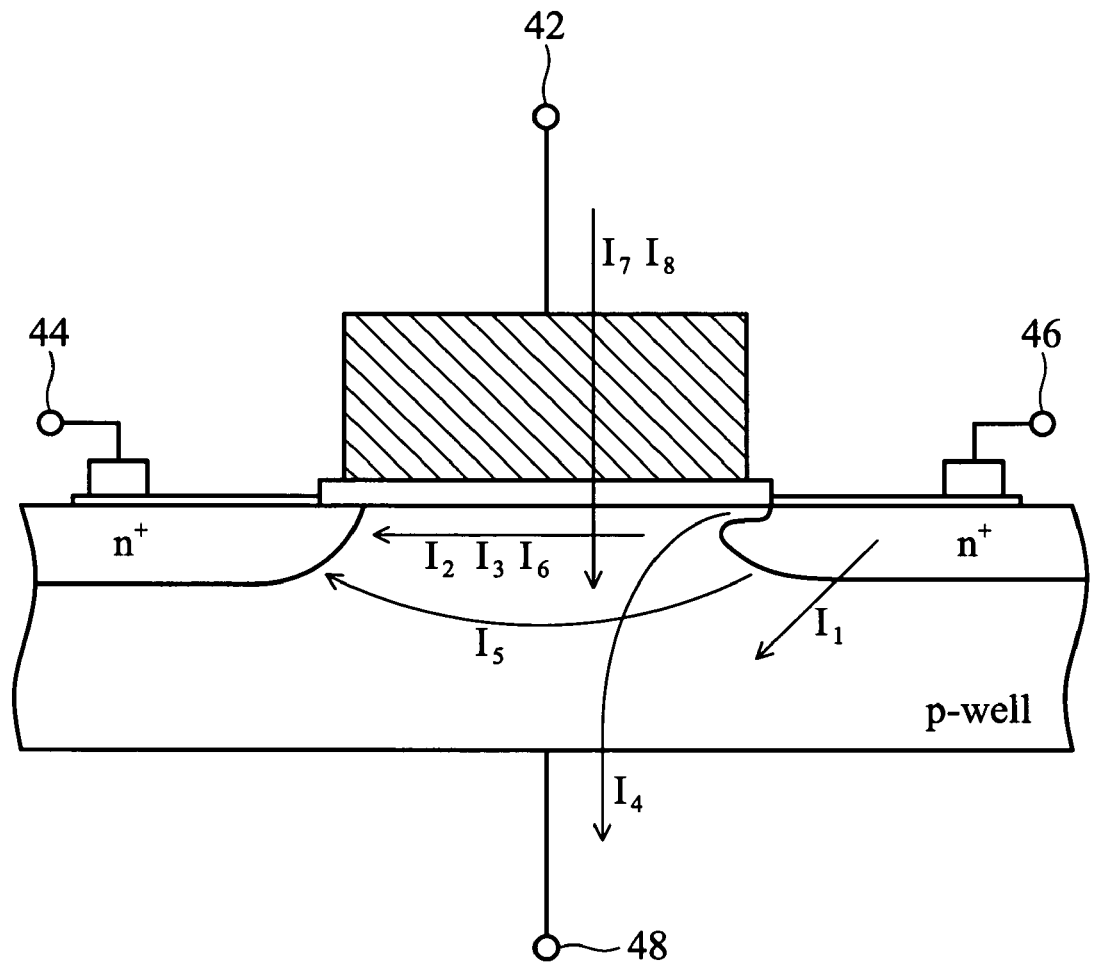
FIG. 3 shows current leakage sources in a transistor 40.
Figure 4:
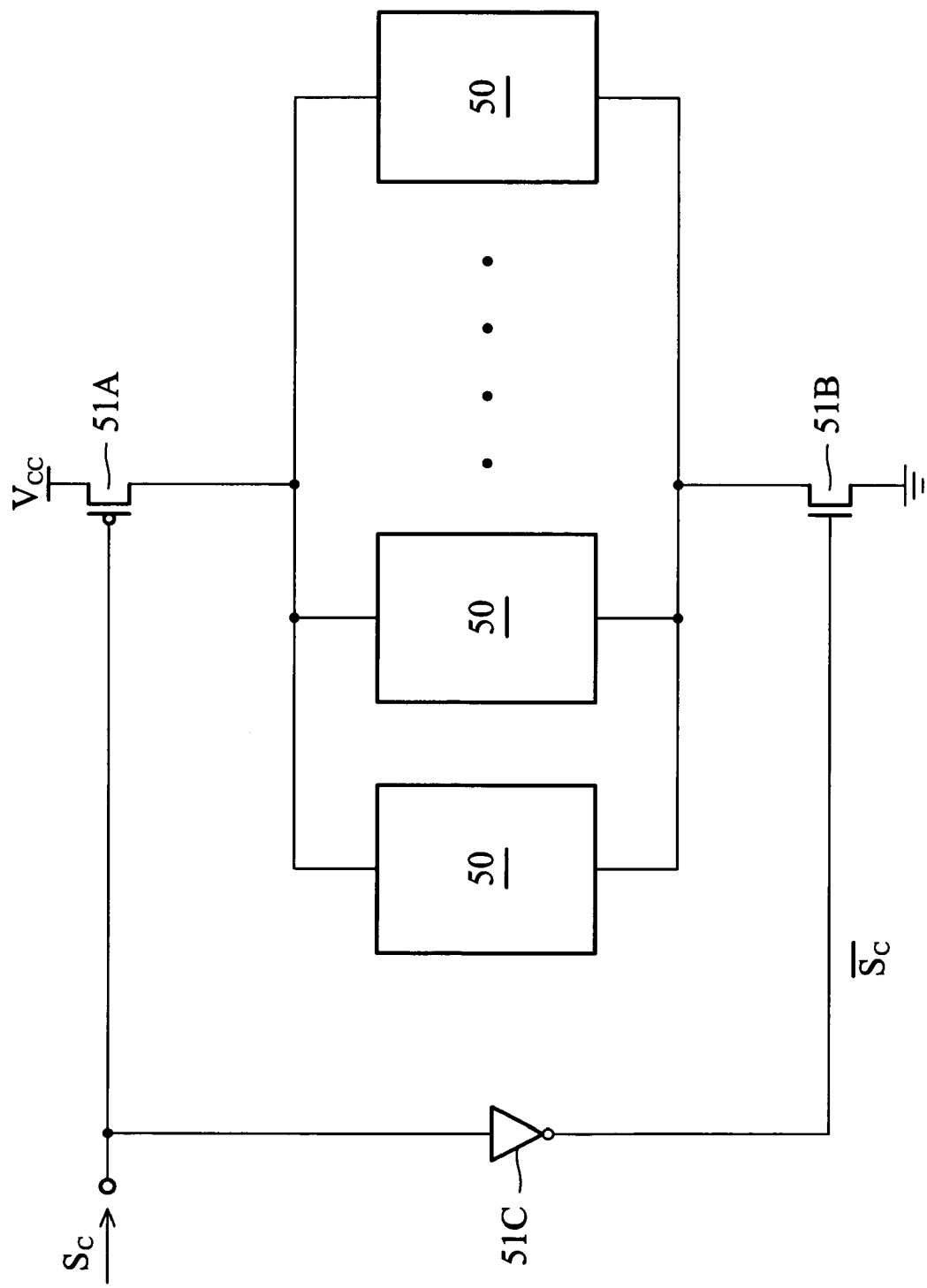
FIG. 4 is a circuit diagram of a power management circuit according to the embodiment of the present invention.

FIG. 4 is a circuit diagram of a power management circuit according to an embodiment of the present invention. The power management circuit switches memory cells 50 between normal and standby modes according to a power control signal Sc. The memory cells 50 can be static random access memory cells, connected between PMOS transistor 51A and NMOS transistor 51B.

PMOS transistor 51A (head switch) is coupled between a power voltage Vcc and the memory cells 50. The gate of the PMOS transistor 51A receives the power control signal Sc. NMOS transistor 51B (foot switch) is coupled between a ground voltage and memory cell 50. PMOS transistor 51A is turned off to disconnect a current path between memory cell 50 and the ground voltage. Inverter 51C is connected between the gate of PMOS transistor 51A and that of NMOS transistor 51B, which inverts the power control signal Sc to a reverse power control signal $\overline{Sc}$. The reverse power control signal $\overline{Sc}$ is applied to the gate of the NMOS transistor 51B. Thus, PMOS transistor 51A and NMOS transistor 51B are turned off to disconnect the current path between power voltage Vcc and the ground voltage when the power control signal Sc is at a high voltage level. Thus, the memory cells 50 operate in the standby mode. It is noted that one pair comprising PMOS transistor 51A and NMOS transistor 51B may control the power connection of a plurality of memory cells 50.

Figure 5:
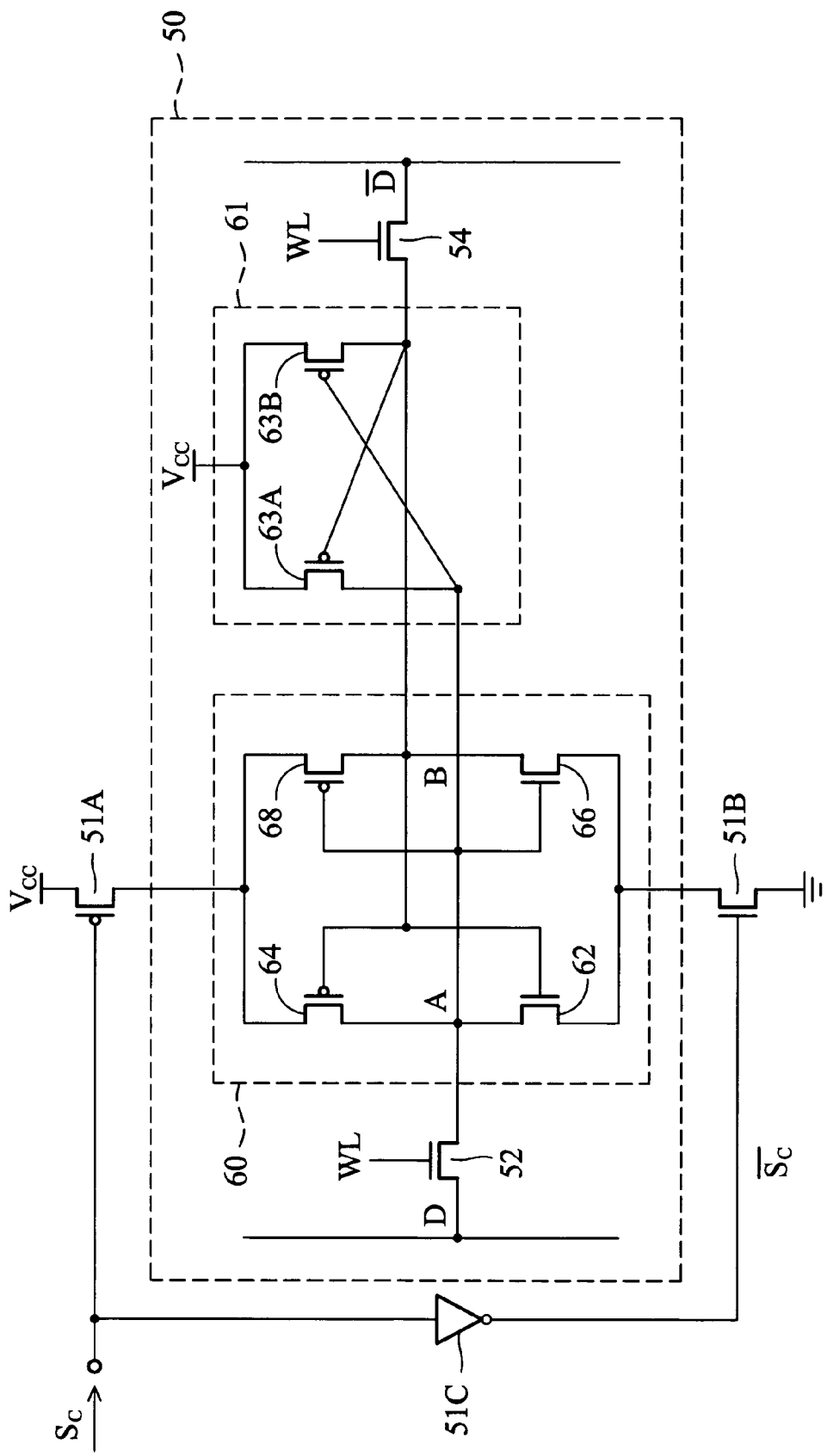
FIG. 5 is a circuit diagram of a power management circuit and the memory cell 50 according to the embodiment of the present invention.

FIG. 5 is a circuit diagram of a power management circuit and the memory cell 50 according to an embodiment of the present invention. Here, one memory cell 50 connected between PMOS transistor 51A and NMOS transistor 51B is described.

Memory cell 50 comprises a pair of NMOS access transistors 52 and 54 that allow a differential voltage on the digit lines D, $\overline{D}$, to be read from and written to a storage circuit 60 of the memory cell 50. The switching of the NMOS access transistors 52 and 54 is determined according to the voltage level of a word line WL. The storage circuit 60 comprises NMOS pull-down transistors 62 and 66 that are coupled in a positive-feedback configuration with PMOS pull-up transistors 64 and 68, respectively. The connection point of the drains of NMOS transistor 62 and PMOS transistor 64 is node A, and the connection point of the drains of NMOS transistor 66 and PMOS transistor 68 is node B. The gates of NMOS transistor 62 and PMOS transistor 64 are connected to node B, and the gates of NMOS transistor 66 and PMOS transistor 68 are connected to node A. The sources of PMOS transistors 64 and 68 are connected to PMOS transistor 51A, and the sources of NMOS transistors 62 and 66 are connected to NMOS transistor 51B. Nodes A and B are complementary input/output nodes of the storage circuit 60, and the respective complementary logic values at these nodes represent the state of the memory cell 50. For example, when the node A is at logic "1", and the node B is at logic "0", the memory cell 50 is storing a logic "1". Conversely, when the node A is at logic "0" and the node B is at logic "1", the SRAM cell 12 is storing a logic "0". Thus, the memory cell 50 is bitable, i.e., the memory cell 50 can have one of two stable states, logic "1" or logic "0".

Latch circuit 61 is coupled between the power voltage $V_{cc}$ and the complementary input/output nodes A and B of the storage circuit 60 to preserve the voltage level thereof, comprising PMOS transistors 63A and 63B.

PMOS transistor 63A comprises a source coupled to power voltage Vcc, a drain coupled to the gate of PMOS transistor 68 and node A, and a gate coupled to the node B. PMOS transistor 63B comprises a source coupled to power voltage Vcc, a drain coupled to the gate of PMOS transistor 64 and node B, and a gate coupled to the node A.

The threshold voltages of NMOS transistor 51B, and PMOS transistors 51A, 63A and 63B are higher than those in the storage circuit 60, such as PMOS transistors 64 and 68 and the NMOS transistors 62 and 66. Alternately, the oxide layers of NMOS transistor 51B, and PMOS transistors 51A, 63A and 63B are thicker than those of PMOS transistors 64 and 68 and the NMOS transistors 62 and 66.

When power control signal Sc is at low voltage level, PMOS transistors 51A and NMOS transistors 51B are turned on and PMOS transistors 63A and 63B act as an extra load. Thus, memory cell 50 outputs data with a predetermined logic level from the complementary pair of node A and B according to data stored in the memory cell. When power control signal Sc switches to high voltage level, PMOS transistor 51A and NMOS transistor 51B are turned off. Thus, memory cell 50 operates in standby mode. In addition, a predetermined logic level (high logic level as an example) of node A is applied to the gate of PMOS transistor 63B, and an inverted logic level (low logic level as an example) of node B is applied to the gate of PMOS transistor 63A. Thus, PMOS transistor 63A is turned on to maintain the high logic level of data signal output Q. Thus, output state of memory cell 50 is preserved by latch circuit 61.

In addition, the NMOS transistor 51B (foot switch) in the embodiment may be eliminated to simplify design. However, current leakage of the memory cell 50 will be more serious than that with the foot switch, but still less than the conventional circuit without the head switch.

As transistors 51 and 53, and the transistors 63A and 63B of latch circuit 61 are fabricated with high threshold voltage and thicker gate oxide process, subthreshold leakage current and gate leakage current thereof are respectively reduced by the high threshold voltage and the thicker gate oxide layer during standby mode.

Accordingly, the power management circuit of an embodiment of the present invention does not alter the normal operation of the memory cells in normal mode. In addition, the head switch is turned off to disconnect the logic cells from the power supply. Thus, the subthreshold leakage and gate leakage of the memory cells is prevented. In addition, the output state of the memory cell is preserved by the latch circuit, such that the high state and low state are sustained. Moreover, an embodiment of the present invention is totally transparent to circuit designs, with no need to design an analog charge pump or use complex power design tools to partition the complicated circuit design. In addition, the memory cell resumes normal operation without interruption when the circuit returns to normal mode. Thus, the advantages of the present invention are a simple extra circuit design, alleviated subthreshold and gate leakage, no creation of signal variation during normal circuit operation such as in the back-biased method, preservation of normal operational circuit states, no vector dependence and transparent power saving for circuit design.

The foregoing description of the preferred embodiments have been presented for purposes of illustration and description. Obvious modifications or variations are possible in light of the above teaching. The embodiments were chosen and described to provide the best illustration of the principles of the invention and its practical application to thereby enable those skilled in the art to utilize the various embodiments and their various modifications, as are suited to the particular use contemplated. All such modifications and variations are within the scope of the present invention.

What is claimed is:

1. A memory cell for a first bit line, a second bit line, a word line and a power voltage, the memory cell comprising:
    a first PMOS transistor comprising a first gate, a first drain, and a first source coupled to the power voltage;
    a first NMOS transistor comprising a second gate coupled to the first gate, a second drain coupled to the first drain, and a second source coupled to a ground voltage, wherein the connection point of the first drain and the second drain is a first terminal;
    a second PMOS transistor comprising a third gate coupled to the first terminal, a third drain coupled to the first gate, and a third source coupled to the power voltage;
    a second NMOS transistor comprising a fourth gate coupled to the first terminal, a fourth drain coupled to the third drain, and a fourth source coupled to the ground voltage, wherein the connection point of the third drain and the fourth drain is a second terminal;
    a first switch coupled between the first bit line and the first terminal, switched according to a voltage level of the word line;
    a second switch coupled between the second bit line and the second terminal, switched according to the voltage level of the word line; and
    a latch circuit having a power terminal directly connected to the power voltage, and coupled between the first terminal and the second terminal to preserve the voltage levels respectively of the first terminal and the second terminal.

2. The memory cell as claimed in claim 1, wherein the latch circuit comprises:
    a third PMOS transistor comprising a fifth gate coupled to the second terminal, a fifth drain coupled to the first terminal, and a fifth source coupled to the power voltage; and
    a fourth PMOS transistor comprising a sixth gate coupled to the first terminal, a sixth drain coupled to the second terminal, and a sixth source coupled to the power voltage.

3. The memory cell as claimed in claim 2, wherein each of the first NMOS transistor, the first PMOS transistor, the second PMOS transistor, and the second PMOS transistor comprises a first gate oxide layer and a first threshold voltage.

4. The memory cell as claimed in claim 3, wherein each of the third PMOS transistor and the fourth PMOS transistor comprises a second gate oxide layer thicker than the first gate oxide layer.

5. The memory cell as claimed in claim 3, wherein each of the third PMOS transistor and the fourth PMOS transistor comprises a second threshold voltage higher than the first threshold voltage.

6. A circuit for power management of a memory cell comprising a first terminal, a second terminal and a power input terminal, and switching between normal and standby modes according to a power control signal, the circuit for power management comprising:
    a first power switch coupled between a power voltage, the power control signal and the memory cell, wherein the first power switch is turned off to disconnect the power voltage and the memory cell when the power control signal is at a predetermined level, such that the memory cell operates in standby mode, wherein the memory cell is coupled between a first bit line, a second bit line and a word line; and
    a latch circuit coupled between the power voltage, the first terminal and the second terminal to preserve the voltage levels respectively of the first terminal and the second terminal when the memory cell operates in the standby mode, wherein the latch circuit comprises:
        a third PMOS transistor comprising a fifth gate coupled to the second terminal, a fifth drain coupled to the first terminal, and a fifth source coupled to the power voltage; and
        a fourth PMOS transistor comprising a sixth gate coupled to the first terminal, a sixth drain coupled to the second terminal, and a sixth source coupled to the power voltage.

7. The circuit for power management as claimed in claim 6, wherein the memory comprising:
    a first PMOS transistor comprising a first gate, a first drain, and a first source coupled to the power voltage;
    a first NMOS transistor comprising a second gate coupled to the first gate, a second drain coupled to the first drain, and a second source coupled to a ground voltage, wherein the connection point of the first drain and the second drain is the first terminal;

a second PMOS transistor comprising a third gate coupled to the first terminal, a third drain coupled to the first gate, and a third source coupled to the power voltage;

a second NMOS transistor comprising a fourth gate coupled to the first terminal, a fourth drain coupled to the third drain, and a fourth source coupled to the ground voltage, wherein the connection point of the third drain and the fourth drain is the second terminal;

a first switch coupled between the first bit line and the first terminal, switched according to a voltage level of the word line; and a second switch coupled between the second bit line and the second terminal, switched according to the voltage level of the word line.

8. The circuit for power management as claimed in claim 6, wherein the first power switch is a fifth PMOS transistor having a seventh gate coupled to the power control signal.

9. The circuit for power management as claimed in claim 8, wherein the predetermined level is a low logic level.

10. The circuit for power management as claimed in claim 9, further comprising a second power switch coupled between the second source, the fourth source and the ground voltage, wherein the second power switch is turned off when the power control signal is at the predetermined level.

11. The circuit for power management as claimed in claim 10, wherein the second switch is a third NMOS transistor having an eighth gate coupled to a reverse power control signal.

12. The circuit for power management as claimed in claim 11, further comprising an inverter coupled between the seventh gate and the eighth gate.

13. The circuit for power management as claimed in claim 10, wherein each of the first NMOS transistor, the first PMOS transistor, the second PMOS transistor, and the second PMOS transistor comprises a first gate oxide layer and a first threshold voltage.

14. The circuit for power management as claimed in claim 13, wherein each of the third PMOS transistor, the fourth PMOS transistor, the fifth PMOS transistor and the third NMOS transistor comprises a second gate oxide layer thicker than the first gate oxide layer.

15. The circuit for power management as claimed in claim 13, wherein each of the third PMOS transistor, the fourth PMOS transistor, the fifth PMOS transistor and the third NMOS transistor comprises a second threshold voltage higher than the first threshold voltage.

16. The circuit for power management as claimed in claim 10, wherein a plurality of memory cells is coupled between the first power switch and the second power switch.

17. The circuit for power management as claimed in claim 6, wherein the first power switch is coupled to a plurality of memory cells.

18. The circuit for power management as claimed in claim 6, wherein the memory cell is a static random access memory.

19. A power management circuit, comprising:
a memory cell coupled between a first bit line, a second bit line and a word line, the memory cell comprising:
  a first PMOS transistor comprising a first gate, a first drain, and a first source;
  a first NMOS transistor comprising a second gate coupled to the first gate, a second drain coupled to the first drain, and a second source, wherein the connection point of the first drain and the second drain is a first terminal;
  a second PMOS transistor comprising a third gate coupled to the first terminal, a third drain coupled to the first gate, and a third source coupled to the first source;
  a second NMOS transistor comprising a fourth gate coupled to the first terminal, a fourth drain coupled to the third drain, and a fourth source coupled to the second source, wherein the connection point of the third drain and the fourth drain is a second terminal;
  a first switch coupled between the first bit line and the first terminal, switched according to a voltage level of the word line; and
  a second switch coupled between the second bit line and the second terminal, switched according to the voltage level of the word line, wherein the memory cell switches between normal and standby modes according to a power control signal;
a first power switch coupled between a power voltage, the power control signal and a connection point of the first source and the third source, wherein the first power switch is turned off to disconnect the power voltage and the memory cell when the power control signal is at a predetermined level, such that the memory cell operates in standby mode; and
a latch circuit having a power terminal directly connected to the power voltage, and coupled between the first terminal and the second terminal to preserve the voltage levels respectively of the first terminal and the second terminal when the memory cell operates in the standby mode.

20. The power management circuit as claimed in claim 19, wherein the latch circuit comprises:
a third PMOS transistor comprising a fifth gate coupled to the second terminal, a fifth drain coupled to the first terminal, and a fifth source coupled to the power voltage; and
a fourth PMOS transistor comprising a sixth gate coupled to the first terminal, a sixth drain coupled to the second terminal, and a sixth source coupled to the power voltage.

21. The power management circuit as claimed in claim 20, wherein the first power switch is a fifth PMOS transistor having a seventh gate coupled to the power control signal.

22. The power management circuit as claimed in claim 21, wherein the predetermined level is a low logic level.

23. The power management circuit as claimed in claim 22, further comprising a second power switch coupled between the second source, the fourth source and the ground voltage, wherein the second power switch is turned off when the power control signal is at the predetermined level.

24. The power management circuit as claimed in claim 23, wherein the second switch is a third NMOS transistor having an eighth gate coupled to a reverse power control signal.

25. The power management circuit as claimed in claim 24, further comprising an inverter coupled between the seventh gate and the eighth gate.

26. The power management circuit as claimed in claim 24, wherein each of the first NMOS transistor, the first PMOS transistor, the second PMOS transistor, and the second PMOS transistor comprises a first gate oxide layer and a first threshold voltage.

27. The power management circuit as claimed in claim 26, wherein each of the third PMOS transistor, the fourth PMOS transistor, the fifth PMOS transistor and the third NMOS transistor comprises a second gate oxide layer thicker than the first gate oxide layer.

28. The circuit for power management as claimed in claim 26, wherein each of the third PMOS transistor, the fourth PMOS transistor, the fifth PMOS transistor and the third NMOS transistor comprises a second threshold voltage higher than the first threshold voltage.

29. The power management circuit as claimed in claim 19, wherein the memory cell is a static random access memory.

* * * * *